(12) United States Patent
Hitchcock

(10) Patent No.: US 6,329,803 B1
(45) Date of Patent: Dec. 11, 2001

(54) MAGNETICALLY ASSISTED SWITCH CIRCUIT

(75) Inventor: Roger N. Hitchcock, San Leandro, CA (US)

(73) Assignee: Varian Medical Systems, Inc., Palo Alto, CA (US)

( * ) Notice: Subject to any disclaimer, the term of this patent is extended or adjusted under 35 U.S.C. 154(b) by 0 days.

(21) Appl. No.: 09/703,515

(22) Filed: Oct. 31, 2000

(51) Int. Cl.$^7$ ................................ G05F 1/40; G05F 1/10
(52) U.S. Cl. ............................................. 323/288; 323/222
(58) Field of Search .................................... 323/220, 222, 323/268, 270, 271, 273, 282, 288, 291; 320/166, 167; 363/50, 55

(56) References Cited

U.S. PATENT DOCUMENTS

| | | | |
|---|---|---|---|
| 5,331,234 | 7/1994 | Merritt et al. ........................ | 307/631 |
| 5,694,025 | * 12/1997 | Oglesbee et al. ........................ | 320/49 |
| 5,706,183 | * 1/1998 | Abe et al. ............................... | 363/18 |
| 6,005,370 | * 12/1999 | Gustavson et al. .................... | 320/137 |
| 6,154,377 | * 11/2000 | Balakrishnan et al. ................ | 363/21 |

OTHER PUBLICATIONS

Donaldson, "A Hybrid Anode Reactor for the SLAC Modulator," 1994 Modulator Symposium; pp. 136–139.
Hudgins et al., "High di/dt Switching With Thyristors," 1988 Modulator Symposium; pp. 292–298.
McDuff, "Fast–Switched Laser Power Circuits," Lasers & Optronics, August 1990; pp. 57–62.
Petr et al., A Parallel Thyraton Pulser with Magnetic Sharpening for Large HgBr Lasers; SPIE, vol. 735 Pulse Power for Lasers (1987); pp. 60–64.

* cited by examiner

Primary Examiner—Matthew Nguyen
(74) Attorney, Agent, or Firm—Workman, Nydegger & Seeley

(57) ABSTRACT

A switching circuit for selectively discharging energy from a pulse forming network (PFN) or capacitor in the form of pulses is described. The switching circuit is comprised of a high power solid state switch configured to selectively discharge energy from the PFN or capacitor to the input of a transformer. Disposed between the PFN and the transformer is a magnetic assist switch, which improves the operating characteristics of the solid state switch. Directly connected to the magnetic assist switch is a reset bias circuit, which provides a reset bias signal and improves the operating characteristics of the assist switch. The same circuit, connected to a turn of the assist switch, also provides a bias reset signal to the transformer, thereby eliminating the need for additional bias circuitry for that component.

15 Claims, 2 Drawing Sheets

MAGNETICALLY ASSISTED SWITCH CIRCUIT

BACKGROUND OF THE INVENTION

1. The Field of the Invention

The present invention relates generally to switching circuits. More specifically, embodiments of the present invention are directed to circuits for providing magnetic assistance to high power switching devices, such as those used in high power modulator circuits in applications such as radar, accelerators, medical accelerators, pulsed lasers and the like.

2. The Relevant Technology

A number of applications require the use of very high current pulses of extremely short and precise duration. For example, various types of pulse forming networks or capacitor loads are used to supply short duration, fast-rising, high peak-amplitude voltage and current pulses to various types of loads, such as medical linear accelerator systems, magnetrons, laser systems and the like. A typical approach for providing such pulses is to deliver energy to an intermediate pulse forming network or storage capacitor, and then utilize a high power switching device to accurately discharge the energy into a load, such as the linear accelerator, laser, etc.

It will be appreciated that the delivery of a fast-rising, short duration and high peak-amplitude voltage/current pulse is dependent largely on the operating efficiency of the switching device used. Moreover, in such applications involving high power pulses and requiring high frequency and extended operating periods, the switches used must be reliable. To improve switching efficiencies and reliability, such switches are often supplemented with a saturable reactor device, typically referred to as a magnetic assist switch. For example, in thyratron-switched circuits where large currents must be switched quickly (i.e., when large values of di/dt are present), a saturable magnetic switch is often connected in series with the tube. Use of the magnetic device provides several advantages. First, it reduces the commutation losses typically associated with a high power switch, such as a thyratron and the like. For example, the use of a magnetic switch provides magnetic pulse compression that improves switch life by reducing the amount of anode dissipation during the commutation phase of the thyratron. This also reduces cooling requirements. Second, the magnetic switch reduces switch damage. In particular, it reduces the amount of anode damage caused by high-energy electrons associated with the initial period of the commutation switch phase. This also reduces the likelihood of exposing impurities embedded in the anode to other portions of the switch tube. Also, use of a saturating magnetic switch in series with the thyratron maintains the integrity of the anode surface, and therefore maintains the voltage integrity of the switch. Consequently, use of this type of saturating magnetic device improves the primary switch life, and increases the operating efficiency of the primary switch.

However, while the overall usefulness of the magnetic switch assist has been recognized, the manner of using the device has resulted in some undesirable problems. In particular, the magnetic switch device has traditionally been connected in series with the primary switch directly to the high voltage connection of the primary switch. Interconnection of the components in this manner makes it difficult to connect a reset bias supply circuit to the magnetic material portion of the magnetic switch, and thus requires a magnetic assist switch that is significantly larger that what would otherwise be desired. This increases the number and/or size of the electronic components needed, and thus increases the overall cost and complexity of the of the switch circuit.

Consequently, there is a need for a switching circuit that is capable of receiving energy from an intermediate pulse forming network or storage capacitor, and then discharging the energy into a load, such as the linear accelerator, laser, etc. Further, it would be an improvement if the device utilized a magnetic switch assist device during the turn-on phase. Moreover, it would be an improvement if the circuit provided the ability to utilize a reset bias supply signal for use by the magnetic switch, but that does so in a manner so as to utilize a minimal number of electrical components. Further, it would be desirable if the reset bias was provided in a manner so as to reduce the amount of saturated inductance needed in the magnetic switch and thereby improve the ability to provide short pulse durations and fast pulse rise times. It would also be an improvement if the magnetic switch device would have a lower overall physical package size, thereby reducing the physical space and cost associated with the overall circuit. Embodiments of the present invention address these and other needs.

BRIEF SUMMARY OF EMBODIMENTS OF THE INVENTION

In view of these and other problems present in the prior art, it is an overall objective of the present invention to provide an improved switch circuit and method that is capable of discharging energy from a pulse forming network or capacitor load to a load, such as a linear accelerator, laser, etc., in the form of a fast-rising, short duration and high peak-amplitude voltage/current pulse. Moreover, it is an overall general objective to provide a circuit that utilizes a minimal number of circuit components, and that also provides the advantages otherwise associated with the use of a magnetic assist switch. Similarly, it is an overall objective to provide a circuit in which the magnetic assist switch is physically smaller in size due to a lower required saturated inductance requirement, by virtue of a bias reset signal. The circuit and method contemplated have ideal application in connection with high power modulator circuits, such as those that may be used in such applications and devices that include radar, accelerators, medical accelerators (e.g., klystron devices), pulsed lasers and the like.

By way of summary, embodiments of the present invention are directed to an improved switch circuit and method, that receives energy from a pulse forming network or capacitor load, and that is capable of discharging that energy to another load in the form of a fast-rising, short duration and high peak-amplitude voltage/current pulse. In a preferred embodiment, the switching circuit includes at least one high power, solid state switch device that has a first input electrically connected to a first terminal of the energy storage circuit (e.g., a pulse forming network or capacitive load). The switch is oriented so as to be capable of selectively discharging energy from the energy storage circuit to the input of a step-up pulse transformer. The output winding of the transformer is then connected to the load that requires the output pulse (e.g., the linear accelerator, laser system, etc).

Disposed between the energy storage circuit and the step-up pulse transformer is a saturable reactor device that provides a predetermined amount of saturated and unsaturated inductance. In preferred embodiments, this device is comprised of a magnetic assist switch, which has an input terminal connected to an output terminal of the energy storage circuit. An output terminal of the magnetic assist switch is then connected to the primary winding of the pulse transformer. The magnetic assist switch provides a predetermined level of unsaturated inductance so as to reduce the overall switching losses of the solid state switch, and to improve the reliability and operating life of the solid state switch.

Preferred embodiments further include a bias circuit, comprised of a DC reset bias supply and a reset bias inductor. This circuit is electrically connected directly to at least one turn of the magnetic assist switch so that the bias circuit is capable of supplying a bias reset signal to the core of the assist switch, thereby providing a larger magnetic flux swing within the switch and resulting in a lower saturated inductance. This improves the overall operating characteristics of the magnetic assist switch in a manner so that a smaller magnetic switch can be used. Moreover, the DC reset bias supply is connected to the magnetic assist switch in a manner so that the same circuit also supplies a bias signal to the pulse transformer. In this way, additional and dedicated bias circuitry is not needed for the pulse transformer.

Preferred embodiments of the present invention provide several distinct advantages over the prior art. In particular, the circuit provides advantages associated with the use of a magnetic assist switch, namely, increasing the operating efficiency and operating life of the high-power solid state switch. Moreover, by orienting the assist switch in the manner described, preferred embodiments allow for a bias signal to be supplied to the assist switch so as to require an overall smaller device. Further, the same bias signal can also be used to reset the pulse transformer, thereby eliminating the need for additional dedicated circuitry. Again, this reduces the cost and complexity of the overall circuit, while at the same time improving its overall operating characteristics.

These and other objects, features and advantages of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE PREFERRED EMBODIMENTS

Reference will now be made to the drawings to describe in further detail presently preferred embodiments of the invention. It is to be understood that the drawings are diagrammatic and schematic representations of presently preferred embodiments of the invention, and they should not be construed as limiting the scope of the invention.

In general, embodiments of the invention are directed to a method and electrical circuit for efficiently discharging energy from a pulse forming networks or capacitor to a load in the form of a high peak-amplitude voltage/current pulse. Embodiments of the present invention will have particular applicability in connection with high power modulator circuits, such as those found in radar devices, accelerators, medical linear accelerators, pulsed lasers and the like.

Figure 1:
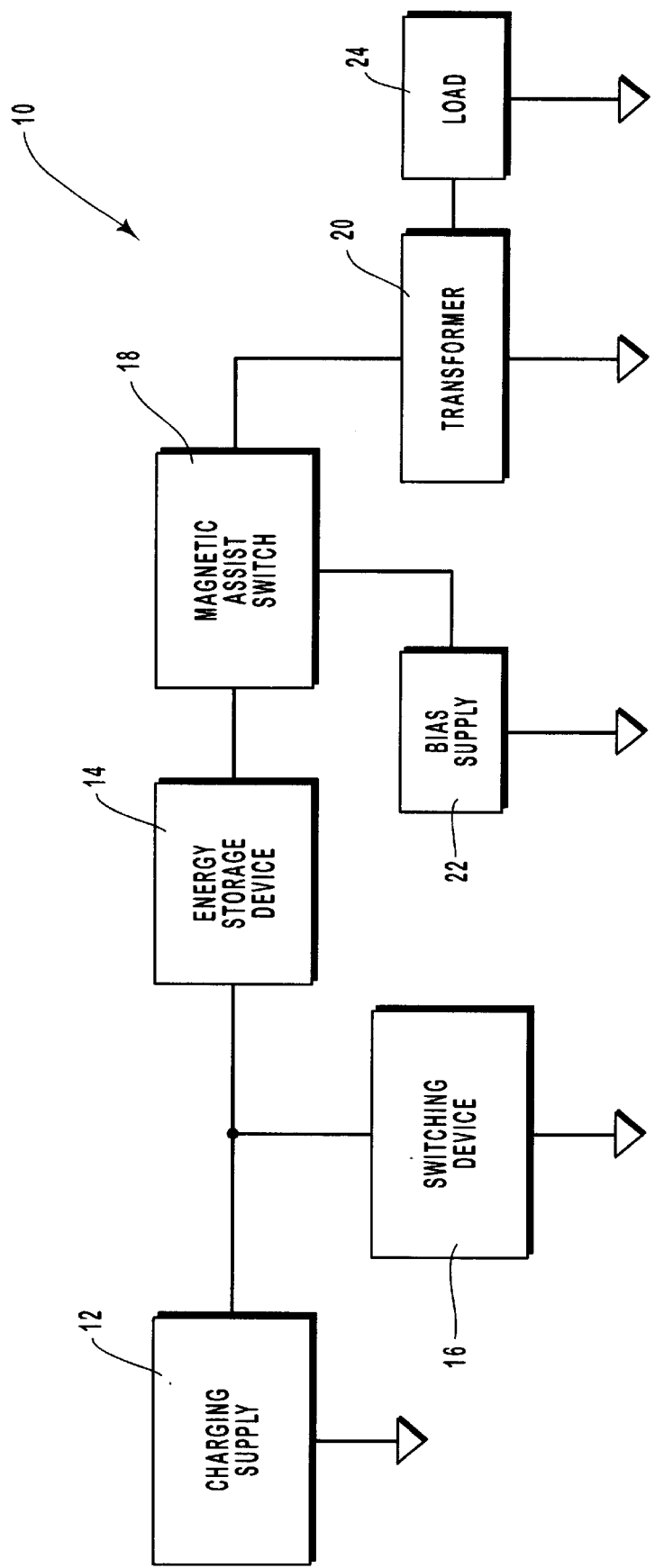
FIG. 1 illustrates a block diagram of one presently preferred embodiment of the switching circuit constructed in accordance with the teachings of the present invention.

Reference is first made to FIG. 1, which illustrates a block diagram of a switching circuit constructed in accordance with one presently preferred embodiment of the present invention. The switching circuit, designated generally at 10, is electrically to a energy coupling circuit, or charging supply, designated at functional box 12. The charging supply can be implemented in a number of ways, as will be appreciated by one of skill in the art, and is generally implemented in a manner so as to provide energy pulses from a voltage source, such as a DC voltage source, at a predefined energy level and at predefined charging cycle. One presently preferred arrangement is disclosed in co-pending patent application, entitled "CIRCUIT FOR COUPLING ENERGY TO A PULSE FORMING NETWORK OR CAPACITOR," filed on Oct. 27, 2000 under attorney docket number 14374.42 and having application Ser. No. 09/698,333 and assigned to the same assignee as this application. That application is incorporated herein by reference in its entirety.

Figure 2:
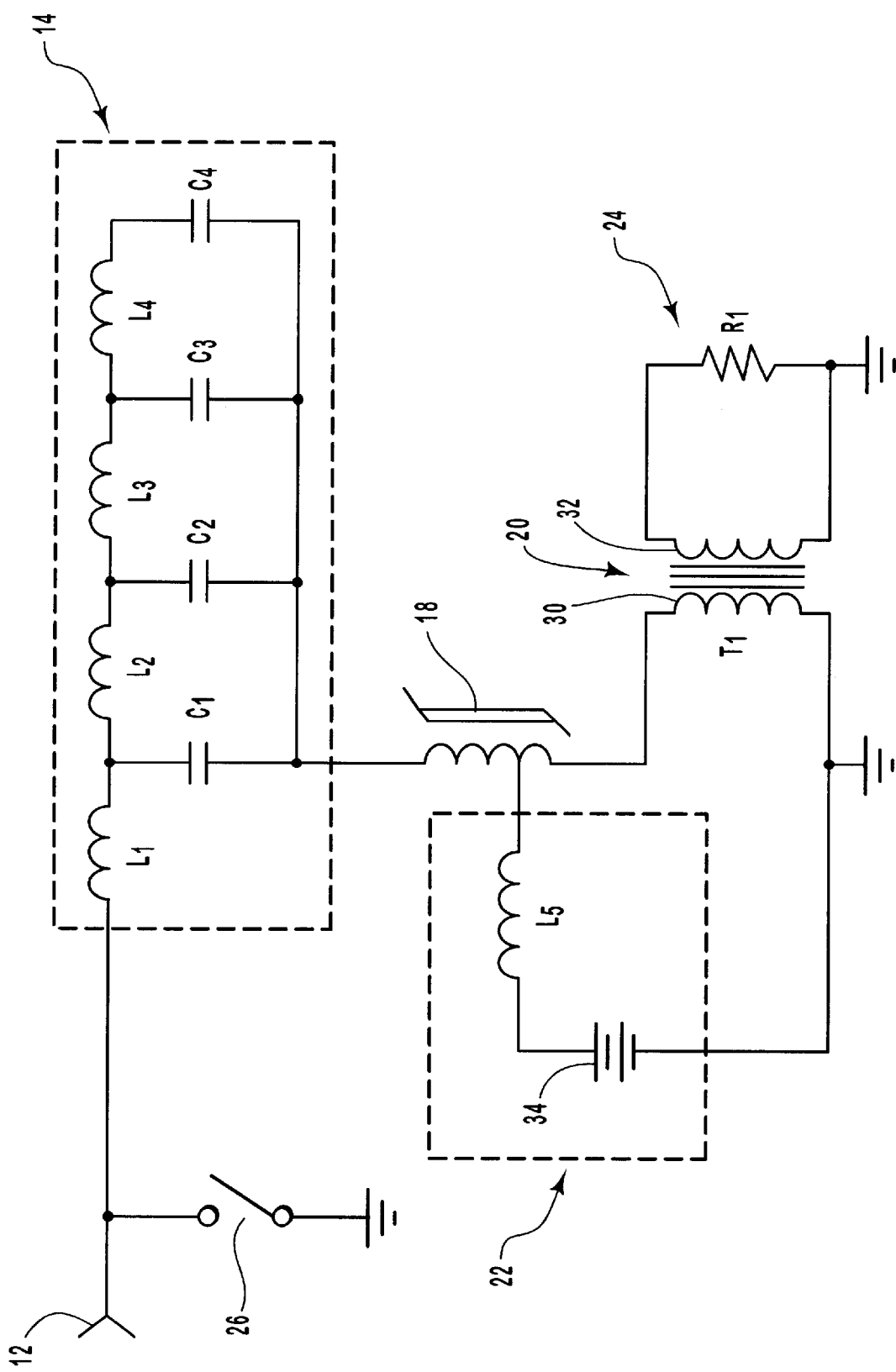
FIG. 2 illustrates an electrical schematic of one presently preferred embodiment of the switching circuit represented in FIG. 1.

With continued reference to FIG. 1, the charging supply 12 is connected to a pulse forming network, capacitor load, or similar type of energy storage load, represented functionally at 14. Again, this particular portion of the circuit can be implemented in a number of ways, dependent largely on the type of application involved, and the characteristics of the desired signal pulse. One presently preferred circuit is illustrated in FIG. 2, which will be described in further detail below.

Connected in series with the an input terminal of the energy storage device 14 is the high voltage terminal of a switching device, designated at functional block 16. It is this device that accurately and efficiently discharges the energy from the intermediate pulse forming network or storage capacitor into the load, such as the linear accelerator, laser, etc., which is functionally designated at box 24 of FIG. 1.

Connected in series with an output terminal of the energy storage device 14 is a saturable reactor device that is capable of providing magnetic pulse compression to the switched signal, such as a magnetic assist switch, functionally represented at box 18. Connected to the output of the magnetic assist switch 18 is a pulse transformer, represented at 20. In particular, and as will be shown in further detail in connection with FIG. 2, the primary winding of the pulse transformer is connected to the magnetic assist switch output, and the secondary winding is connected to a typical load, designated at block 24.

Typically, a bias circuit is connected to the first terminal of the pulse transformer so as to provide a bias reset signal and appropriately bias the core of the pulse transformer, and therefore maximize the magnetic flux swing in the core. However, as is represented in FIG. 1, the bias supply circuit, designated at functional block 22, is connected directly to a winding of the magnetic assist switch 18 so as to provide a bias signal. For example, if the magnetic assist switch 18 has four turns, in a preferred embodiment the connection would be made at the first turn closest to the pulse transformer 20 connection. This type of connection scheme allows a sufficient level of reset current to flow in the magnetic assist switch and thereby maximize the magnetic flux swing in the assist switch. At the same time, a bias signal is also provided to the transformer and the magnetic flux swing in the core of the pulse transformer is similarly optimized—without the need for a separate bias circuit for the transformer. Thus, while the overall efficiency of the switching circuit is maintained, the number and complexity of circuit components required is reduced. Moreover, connection of the bias supply circuit 22 in this manner reduces the overall size of the magnetic assist switch 18 that is needed, and at the same time improves the performance of the magnetic switch by making it more repeatable.

Reference is next made to FIG. 2, which illustrates a schematic showing in further detail one presently preferred embodiment of the switching circuit 10. Input power from a charging supply, as described above, is indicated at 12. Also indicated is a schematic representation of a switch device 26. In a preferred embodiment, switch 26 is a solid-state discharge switch, and is preferably comprised of multiple switches connected in series to ground. Preferred switch types include high current thyristor (HCT) or gate turn off thyristor (GTO) type switches.

As is further shown, the switch 26 is connected to the high voltage input terminal of the pulse forming network (PFN) 14 (or capacitor type energy storage device), which in the illustrated embodiment is illustrated as comprising the inductive and capacitive network shown, that is capable of being charged to a predetermined voltage, and then being discharged through a step-up pulse transformer so as to apply a very high-power, rectangular pulse to a load device. Other circuit arrangements could also be used.

As is further shown, the output terminal of the PFN 14 is connected to a magnetic assist switch, designated at 18, or similar type of saturable reactor device. As previously noted, the magnetic assist switch 18 is generally selected and used to reduce switching losses of the solid-state discharge switch, and to improve the overall operating life of the discharge switch. Of course, the specific type of switch used, including the amount of saturated and unsaturated inductance needed, will be dependent on the type of solid-state switch used, and the particular application involved. In general, the preferred switch is a ferrite-based magnetic switch.

The output terminal of the magnetic assist switch 18 is connected to the primary winding 30 of a step-up pulse transformer $T_1$, designated generally at 20. The secondary winding 32 of the pulse transformer $T_1$ is then connected to the load 24, represented as resistance $R_1$. As noted, the load 24 can include any device requiring the delivery of a very high power, rectangular pulse for operation.

Further illustrated in FIG. 2 is the bias supply circuit 22, which is comprised of a DC reset power supply 34 and a bias inductor $L_5$. As is shown, the bias power supply 34 is connected to common, and the reset bias inductor $L_5$ is connected directly to at least one turn of the magnetic assist switch 18. For instance, in the preferred embodiment, the connection is made at a turn that is proximate to the pulse transformer; in this case, the magnetic assist switch has four turns, and the connection is made at the turn closest to the pulse transformer $T_1$, connection. It will be appreciated that this particular placement of the magnetic assist switch 18 allows the same reset bias supply 22 to be used for resetting the pulse transformer $T_1$, as well as the assist switch 18. As such, no additional components are needed to provide the necessary bias to the magnetic assist switch. This reduces the number of overall components needed, reduces circuit complexity, and reduces overall circuit costs. Also, because the switch 18 has a bias provided, the bias in the core allows a larger magnetic flux swing in the magnetic material. As such, less material is needed to produce the same signal delay, resulting in the need for a physically smaller device. Further, the smaller package results in a lower saturated inductance for the assist switch. This can be especially important for those applications requiring short pulse durations and fast pulse rise times. Also, the bias in the switch core makes the magnetic flux swing more repeatable so that the switch delay is more consistent between pulses and at different temperatures. Again, these features can be very important for those applications requiring precise and accurate timing.

To summarize, it will be appreciated that the illustrated embodiment provides a number of features and advantages over prior art implementations. In particular, the switching circuit provides the advantages of a magnetic assist switch—improved reliability and operating characteristics. However, the circuit also provides DC bias to the magnetic switch by essentially utilizing existing circuit components. As such, in addition to reducing the overall number of electronic components required in the circuit, the approach also results in the ability to use a magnetic switch that has a smaller size, and that provides superior operating characteristics—especially for those applications requiring precise and accurate timing, fast pulse rise times and short pulse durations.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A switching circuit for discharging energy from an energy storage circuit to a load, the switching circuit comprising:

at least one switch device having a first input connected to a first terminal of the energy storage circuit;

a magnetic assist switch having an input terminal connected to a second terminal of the energy storage circuit, a pulse transformer having a primary winding connected to an output terminal of the magnetic assist switch, and a secondary winding in electrical communication with the load; and a bias circuit electrically connected to the magnetic assist switch, whereby the bias circuit is capable of providing a bias signal to the magnetic assist switch and the pulse transformer.

2. A switching circuit as defined in claim 1, wherein the energy storage circuit is comprised of a pulse forming network.

3. A switching circuit as defined in claim 1, wherein the energy storage circuit is comprised of a capacitive load.

4. A switching circuit as defined in claim 1, wherein the at least one switch device is comprised of a solid-state discharge switch selected from one of the following: high current thyristor (HCT) switch and gate turn off thyristor (GTO) switch.

5. A switching circuit as defined in claim 1, wherein the bias circuit is electrically connected to at least one turn of the magnetic assist switch.

6. A switching circuit as defined in claim 5, wherein the bias circuit is electrically connected to a turn of the magnetic assist switch that is closest to the pulse transformer.

7. A switching circuit as defined in claim 1, wherein the bias circuit is comprised of a DC voltage source connected to a bias connector that is electrically connected to the magnetic assist switch.

8. A method for providing magnetic assistance to a switching device in a pulse discharge circuit, the method comprising:

providing at least one primary switch that is capable of selectively discharging energy from a energy storage circuit for delivery to an input of a pulse transformer;

providing a saturable reactor device having a predetermined amount of saturated and unsaturated inductance between the energy storage circuit and the pulse transformer; and providing a bias signal to the saturable reactor device that also serves to provide a reset signal to the pulse transformer.

9. A method as defined in claim 8, wherein the energy discharged is in the form of an electrical pulse having a predefined amplitude, and the pulse is delivered to a load.

10. A method as defined in claim 8, wherein the energy is discharged from an energy storage circuit comprised of a pulse forming network.

11. A method as defined in claim 8, wherein the energy is discharged from an energy storage circuit comprised of a capacitive load.

12. A method as defined in claim 8, wherein the at least one primary switch is a solid-state discharge switch selected from one of the following: high current thyristor (HCT) switch and gate turn off thyristor (GTO) switch.

13. A method as defined in claim 8, wherein the saturable reactor device is comprised of a magnetic assist switch having a predetermined number of inductive turns.

14. A method as defined in claim 8, wherein the bias signal is electrically connected to at least one inductive turn of the saturable reactor device.

15. A method as defined in claim 8, wherein the bias signal is electrically connected to an inductive turn of the saturable reactor device that is closest to the pulse transformer.

* * * * *

UNITED STATES PATENT AND TRADEMARK OFFICE
CERTIFICATE OF CORRECTION

PATENT NO. : 6,329,803 B1
DATED : December 11, 2001
INVENTOR(S) : Roger N. Hitchcock It is certified that error appears in the above-identified patent and that said Letters Patent is hereby corrected as shown below:

Column 1,
Line 66, after "larger" change "that" to -- than --

Column 4,
Line 15, after "electrically" insert -- connected --

Column 7,
Line 12, before "energy" change "a" to -- an --

Signed and Sealed this

Nineteenth Day of November, 2002

*Attest:*

JAMES E. ROGAN
*Attesting Officer*    *Director of the United States Patent and Trademark Office*